United States Patent
Feudel et al.

(10) Patent No.: US 6,822,430 B2
(45) Date of Patent: Nov. 23, 2004

(54) METHOD OF ASSESSING LATERAL DOPANT AND/OR CHARGE CARRIER PROFILES

(75) Inventors: Thomas Feudel, Radebeul (DE); Manfred Horstmann, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/602,577

(22) Filed: Jun. 24, 2003

(65) Prior Publication Data

US 2004/0152222 A1 Aug. 5, 2004

(30) Foreign Application Priority Data

Jan. 30, 2003 (DE) .......................................... 103 03 682

(51) Int. Cl.[7] .......................... G01N 27/00; H01L 21/00
(52) U.S. Cl. ........................................ 324/71.5; 438/17
(58) Field of Search ................................ 438/14, 17, 18; 324/71.1, 71.5

(56) References Cited

U.S. PATENT DOCUMENTS

| | | | |
|---|---|---|---|
| 5,520,769 A | * 5/1996 | Barrett et al. | 438/14 |
| 6,069,485 A | * 5/2000 | Long et al. | 324/769 |
| 6,166,558 A | 12/2000 | Jiang et al. | 324/769 |
| 6,327,555 B1 | 12/2001 | Shimizu et al. | 703/12 |
| 2002/0102752 A1 | 8/2002 | Hunag et al. | 438/17 |
| 2004/0057052 A1 | * 3/2004 | Borden et al. | 356/445 |
| 2004/0063225 A1 | * 4/2004 | Borden et al. | 438/7 |

OTHER PUBLICATIONS

Rösner et al., "Determination of Lateral Drain Profiles From Gate–Drain Overlap Capacitances," Siemens Corporate Research and Technology, pp. 9–10.

* cited by examiner

*Primary Examiner*—Evan Pert
(74) *Attorney, Agent, or Firm*—Williams, Morgan & Amerson, P.C.

(57) ABSTRACT

A cost-efficient and reliable method for assessing lateral dopant profiles includes the estimation of a reference profile formed below a gate structure of a transistor device. The overlap capacitance is then determined for at least two different overlaps, created by different spacer widths, and the lateral extension of a dopant profile to be measured, is estimated on the basis of a relationship between overlap capacitance and spacer width for the reference dopant profile.

36 Claims, 2 Drawing Sheets

METHOD OF ASSESSING LATERAL DOPANT AND/OR CHARGE CARRIER PROFILES

BACKGROUND OF THE INVENTION

1. Field of the Invention

Generally, the present invention relates to the fabrication of integrated circuits, and, more particularly, to metrology techniques that enable the estimation of dopant profiles in active semiconductor regions, such as the drain and source regions of field effect transistors.

2. Description of the Related Art

In the semiconductor industry, there is an ongoing tendency to continuously reduce the feature sizes of circuit elements so as to improve device performance and package density. A major fraction of today's produced integrated circuits are digital devices manufactured by the so-called MOS technology, which involves the fabrication of a huge number of field effect transistor elements, substantially acting as switches. In these transistor elements, a lightly doped channel region separates inversely heavily doped source and drain regions, wherein a gate electrode controlling the formation of a channel in the channel region upon application of an appropriate control voltage is located above the channel region and separated therefrom by a thin insulation layer. The interface between the drain or the source region and the inversely lightly doped channel region forms a PN junction, wherein especially the shape and dimension of that portion of the PN junction connecting the drain or source region to the channel is of great importance to the transistor performance. Moreover, the distance between the source and drain region, also referred to as channel length, is a critical design parameter of the field effect transistor, as the channel length substantially affects the current capability and the switching speed of the transistor device.

During the last decade, the device dimensions of these field effect transistors have been steadily decreased to channel lengths of 0.1 $\mu$m and even less, thereby improving the device performance while at the same time merely requiring modest power consumption when integrated CMOS circuits are considered. Therefore, this type of circuit architecture has become the dominant technology for integrated circuits. In steadily decreasing the feature sizes of transistor elements, one major issue is the formation of doped regions having well-defined shapes and dimensions so as to achieve a required dopant profile within these regions. As these dopant profiles substantially determine the charge carrier distribution, as well as the distribution of the electrical field prevailing in the device during its operation, strictly controlling the dopant profiles is essential to obtain superior device performance. Especially for extremely scaled circuits with dimensions in the deep sub-micron regime, additional problems arise that were unknown so far for transistor elements of the 1 micron range, so that even stricter constraints are imposed on the formation of appropriate dopant profiles.

In sophisticated transistor elements, the dopant profile has to be controlled in at least two dimensions, that is, in a depth direction with respect to a substrate carrying the circuit element and a direction perpendicular to the depth direction, which may also be referred to as lateral direction, to provide for the required charge carrier and field distribution. Since conventional diffusion techniques usually do not allow the formation of a specified dopant profile in a direction facing away from a dopant donating material layer, except for a gradually decreasing dopant concentration due to the nature of the diffusion process, implantation of ions has become the preferred technique for incorporating dopant atoms in a desired concentration at a desired depth of a specified region. The lateral profile or confinement of implanted dopant is usually achieved by forming respective implantation masks that may shield the underlying regions, partially or completely, thereby generating the required lateral profile. Although ion implantation enables the formation of a dopant concentration peak within reasonably restricted device regions, the final shape and dimension of the dopant profile is nevertheless partially determined by diffusion processes, ie., heating processes, that are necessary for activating the dopant atoms, i.e., to place the-dopant atoms at regular lattice sites, and to cure, at least partially, implantation-induced crystal damage.

In highly advanced transistor elements, the dimensions of the doped regions, for example, the source and drain regions with the channel region disposed therebetween, are extremely small and will be reduced in future device generations, so that the process margins in the implantation and the anneal, i.e., the diffusion processes, are continuously becoming more restricted. Therefore, reliable and efficient metrology techniques are required to steadily monitor the dopant profiles obtained by the implantation and anneal processes employed. For this reason, great efforts are being made to develop techniques to obtain information on dopant profiles within circuit elements. It turns out that the dopant concentration in the depth direction may be measured with very high accuracy, whereas substantially no information may be gathered relating to the lateral dopant profile, which is however essential for the functionality of the transistor element. Accordingly, a plurality of metrology techniques have been developed to more or less determine a two-dimensional image of the charge carrier distribution and thus of the dopant profile that is strongly related to the charge carrier distribution measured during the operation of the device. Respective techniques may include scanning capacitance microscopy (SCM), nano-spreading resistance profiling (nano-SRP), atomic force microscopy etch analysis or transmission electron microscopy etch analysis, scanning Kelvin probe force microscopy, and the like. Some of these techniques may provide a spatial resolution of approximately 10 nm as is considered necessary for current and future device generations. Most of these techniques are presently not approved under practical conditions and are still under research so that respective tools having high resolution and accuracy are presently not commercially available. Additionally, the techniques specified above require high effort in terms of sample preparation and tool handling, thereby significantly slowing down the development and testing of new technologies in forming dopant profiles of future device generations.

In view of the problems identified above, there is a need for an improved technique for determining lateral charge carrier and/or dopant profiles in circuit elements.

SUMMARY OF THE INVENTION

The present invention is directed to a technique to assess the lateral dimension of a dopant profile by determining an overlap capacitance of the profile in a structure forming a "capacitor," wherein the overlap capacitance is compared to a "reference" capacitance.

In one illustrative embodiment of the present invention, a method comprises identifying a relationship between a capacitive coupling of a conductor and a doped region formed in a semiconducting substrate tinder the conductor based upon an overlap between the conductor and the doped region. A second doped region is formed under a second conductor and a lateral dimension of an overlap of the second doped region with the second conductor is assessed based upon the identified relationship.

According to another illustrative embodiment of the present invention, a method comprises determining a first capacitive coupling of a reference dopant profile formed in a first semiconductor region to a first conductive region laterally offset from the reference dopant profile by a first dielectric region having a first offset thickness. The method further comprises determining a second capacitive coupling of the reference dopant profile formed in a second semiconductor region to a second conductive region laterally offset from the reference dopant profile by a second dielectric region having a second offset thickness. Moreover, a capacitive coupling of a test dopant profile is determined that is formed in a third semiconductor region to a third conductive region laterally offset from the third semiconductor region by a third dielectric region having a predefined offset thickness. Finally, a lateral distribution of the test dopant profile is assessed on the basis of the first and second capacitive couplings and the first, second and predefined offset thicknesses.

According to a further illustrative embodiment of the present invention, a method of assessing an implanted dopant profile comprises forming a first gate electrode structure with a first sidewall spacer having a first width and forming a second gate electrode structure with a second sidewall spacer having a second width. Then, a dopant profile is formed adjacent to the first and second gate electrode structure with substantially the same process conditions and using the first and second sidewall spacers as an implantation mask, each dopant profile acting as source and drain of a first transistor and a second transistor. Finally, an overlap capacitance of the first and second transistor is determined to establish a dependence of overlap capacitance variation with spacer width variation for the dopant profile.

BRIEF DESCRIPTION OF THE DRAWINGS

The invention may be understood by reference to the following description taken in conjunction with the accompanying drawings, in which like reference numerals identify like elements, and in which.

Figure 1A:
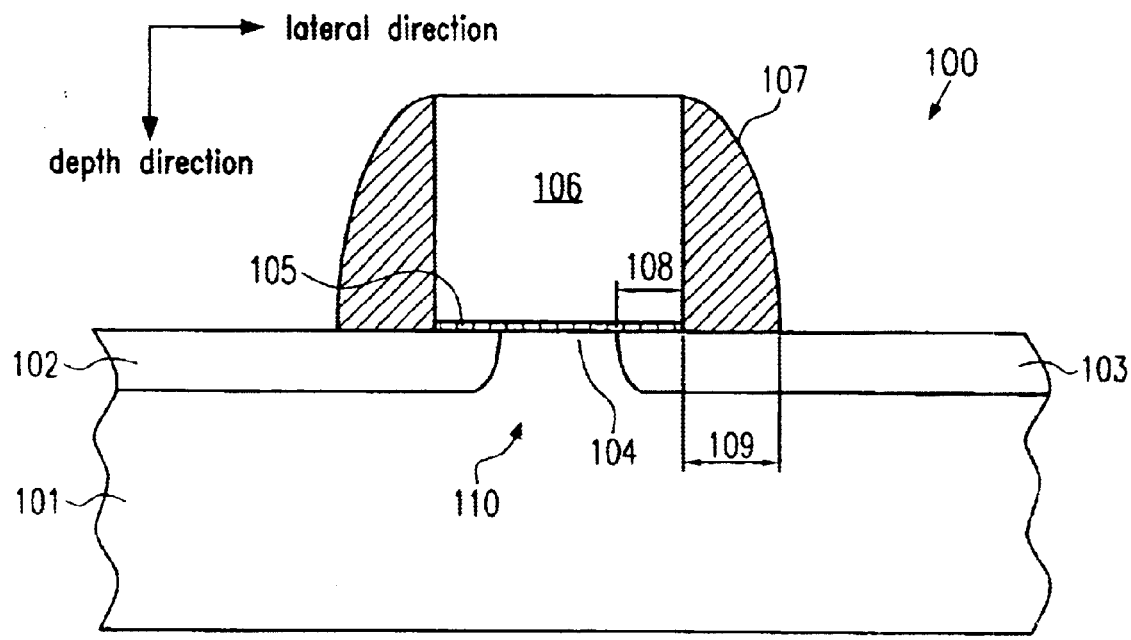
FIG. 1a schematically shows a cross-sectional view of a transistor structure used to determine a lateral dimension of a dopant profile in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, ie., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the consideration that in a transistor structure a so-called overlap capacitance, ie., the capacitance generated by the amount of overlap of the drain or the source region with the overlying gate electrode, directly corresponds to a change in lateral position of the dopant profile forming the drain or source region. By establishing a transistor structure allowing the measurement of the overlap capacitance of a known dopant profile, or a profile formed by well-known process parameters, for one or more known offset positions to obtain a reference value, a new dopant profile under consideration may be evaluated by determining the corresponding overlap capacitance for a known offset position and comparing it with the reference value.

It should be noted that the following illustrative embodiments refer to the determination of the lateral charge carrier profile and thus dopant profile of a drain or source region of a field effect transistor, since the precise control of these dopant profiles is essential for current and future device generations including an extremely reduced channel length and advanced gate insulation structures, to which the drain and source design has to be adapted. The present invention is thus extremely advantageous in assessing and developing implantation, diffusion and anneal schemes for obtaining new types of dopant profiles and for improving presently established process sequences in forming doped semiconductor regions. In the disclosed embodiments, the lateral profiles may be determined by using a transistor structure. However, the principles of the present invention may also be applied to any semiconductor structure that is not necessarily a transistor structure and includes complex dopant profiles formed by a respective implantation and/or diffusion and/or anneal cycle, wherein the transistor structure used for obtaining the information on the lateral dopant profile may represent a measurement tool for any semiconductor structure including a doped region. That is, any process sequence for creating a dopant profile in accordance with specified process requirements may efficiently be assessed by the methods described herein as long as the dopant profile of interest may be "used" as a drain and source profile of a correspondingly designed transistor. For example, if the effects of an altered process recipe are to be examined, the profile in the depth direction may be assessed by well-known methods, whereas the lateral profile may then be evaluated by forming a transistor structure with the previous and the altered process recipes to determine their difference. The transistor structure thus may represent only means for obtaining the required measurement results and does not need to be the subject of investigation per se.

Figure 1E:
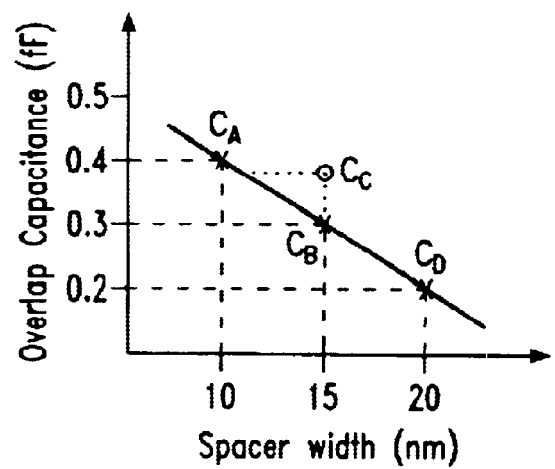
FIG. 1e shows a graph containing measurement values of an overlap capacitance for varying lateral positions of reference profiles and for a profile to be measured.
Figure 1B:
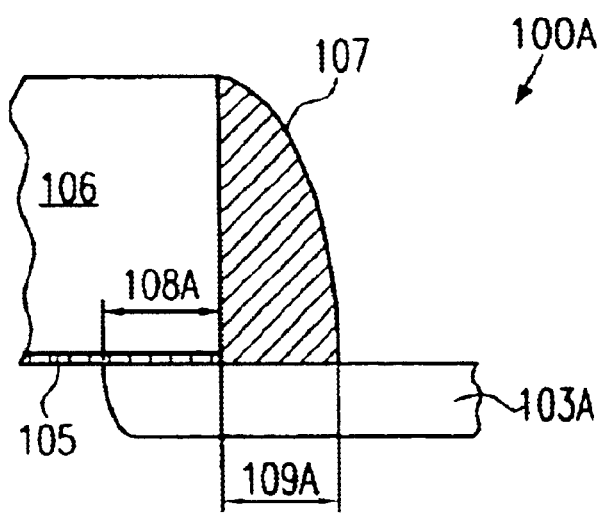
FIGS. 1b-1d schematically show cross-sectional views of a portion of a transistor structure during various steps in determining a lateral extension of a dopant profile.
Figure 1C:
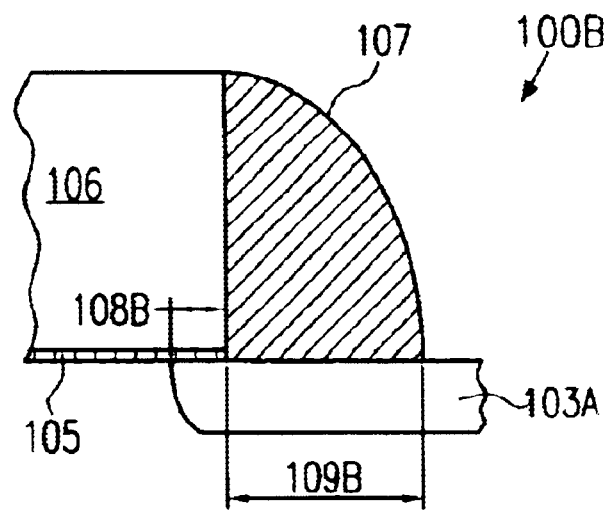

With reference to FIGS. 1a-1c, further illustrative embodiments of the present invention will now be described in more detail. FIG. 1a schematically shows a cross-sectional view of a transistor structure 100 comprising a substrate 101 having formed therein an active region 110, that is a region formed of a semiconductive material with a certain amount of dopant atoms of a specified conductivity type provided therein. In the active region 110, a first doped region 102 and a second doped region 103 are formed and may also be referred to as source and drain regions, wherein, due to the usually symmetrical configuration of the transistor structure 100, either the region 102 or the region 103 may act as the transistor source and drain. The first and second doped regions 102, 103 include dopants of a second conductivity type that is inverse to the conductivity type of the dopants in the active region 110 so that the active region 110 and the first and second doped regions 102, 103 are separated from each other by a P-N junction. The first and second doped regions 102, 103 or the drain and source regions are separated in a lateral direction, indicated as the horizontal direction in FIG. 1a, which is also usually referred to as the length dimension of the transistor structure 100, by a channel region 104, which is also inversely doped compared to the first and second doped regions 102, 103. A gate electrode 106, for example formed of doped polysilicon, is formed above the channel region 104 and a portion of the first and the second doped regions 102, 103 and is separated therefrom by a gate insulation layer 105. Dielectric spacer elements 107 are formed on the sidewalls of the gate electrode 106. Although the spacer elements 107 may not be symmetrical with respect to a depth direction, i.e., in FIG. 1a the vertical direction, a thickness may be assigned to the spacer elements 107 and may be characterized by the lateral bottom extension of the spacer elements 107, indicated by reference number 109. In other embodiments, the spacer elements 107 may exhibit a substantially uniform thickness throughout the entire extension along the depth direction.

As indicated by reference number 108, the second doped region 103 (and of course the first doped region 102) has an overlap region with respect to the gate electrode 106, which causes a certain amount of capacitive coupling of the gate electrode 106 to the second doped region 103 during operation of the transistor structure 100. The magnitude of the capacitive coupling is commonly referred to as overlap capacitance. It should be noted that the overlap capacitance may depend on the operating conditions of the transistor structure 100. This dependency if present may readily be canceled by operating the transistor structure under defined conditions.

A typical process flow for forming the transistor structure 100 may comprise advanced deposition, photolithography and etch techniques to form the gate insulation layer 105 and the gate electrode 106 in accordance with design requirements. It is to be noted that the dimensions and processes for forming the gate electrode 106 and the gate insulation layer 105 are not critical unless the transistor structure 100 itself is the subject of interest. That is, the diffusion behavior of the dopants may depend, among many more aspects, on the presence of specified interfaces so that even the lateral diffusion below a thin silicon dioxide may differ from that below a high-k dielectric layer. Thereafter, the spacer elements 107 may be formed by depositing a dielectric material, for instance a thin silicon nitride layer followed by a silicon dioxide layer, and anisotropically etching the material layer to obtain the spacer elements 107 in a self-aligned fashion. The deposition techniques for forming a dielectric material layer having a well-defined thickness are presently well established and may include process techniques such as chemical vapor deposition (CVD), plasma-enhanced CVD, atomic layer deposition (ALD), and the like. These techniques allow a deposition of material layers in a highly conformal manner, wherein the layer thickness is well controllable so that the spacer width 109 may be precisely controlled within a range of approximately 1 nm or even less, depending on the deposition technique used.

Next, the first and second doped regions 102, 103, i.e., the source and drain regions, are formed, for example, by ion implantation with a specified dopant species with a pre-defined implantation energy and dose for a specified time interval so as to control the dopant profile in the depth direction. During the implantation process, the spacer elements 107 and the gate electrode 106 act as an implantation mask to provide for a required "offset" of the dopant profile as implanted from the channel region 104. Depending on the required dopant profile of the regions 102, 103, the implantation parameters are selected to finally obtain a desired dopant profile. Thus, in certain cases, the implantation sequence may be comprised of a plurality of implantation steps performed with different tilt angles, i.e., the angle formed between the direction perpendicular to the substrate surface and the trajectory of the implanted ions, wherein the dose and/or the implantation energy and/or the type of dopant atoms may also be varied. In other implantation schemes, one or more disposable spacer elements (not shown) may be used to obtain a required lateral dopant profile in the regions 102, 103. In other sophisticated implantation sequences, so-called amorphization implant steps may be performed prior and/or during the implant steps for incorporating the dopant atoms. These amorphization steps may reduce channeling effects, ie., direction-dependent propagation of ions penetrating the active region 104, and may improve the curing of lattice damage in subsequent anneal cycles. In other doping schemes, incorporating dopant atoms into the regions 102, 103 may additionally involve diffusion of the dopant into the underlying material by providing a diffusion layer having incorporated a high concentration of dopant atoms (not shown), or the spacer elements 107 may include dopant atoms in a high concentration that may out-diffuse into the underlying regions 102, 103.

Irrespective of the technique for introducing the dopant atoms into the region 102, 103, one or more anneal cycles are typically performed so as to diffuse the dopant atoms, thereby activating at least a portion thereof and curing crystal damage induced by the previous implantation steps. Depending on the implantation scheme used, anneal temperatures are typically in the range of approximately 500–1100° C. for a time interval from approximately 0.1 seconds to a few minutes. During this anneal cycle, and possibly during any heat treatment processes performed at later stages of the manufacturing process, diffusing of the dopant atoms occurs and leads to a change of the dopant profile as implanted and, consequently, these diffusion effects have to be taken into account by process engineers when designing and developing process sequences for forming dopant profiles. Thereafter, further steps may be carried out to complete the transistor structure 100, such as the formation of silicide regions (not shown) on top of the gate electrode 106 and the regions 102, 103. Moreover, corresponding contacts may be formed on the regions 102, 103 and the gate electrode 106 by well-known process techniques, to ensure proper transistor functionality during operating the device 100.

In other embodiments, the regions 102, 103 may be formed according to implantation schemes with a first doping cycle to form extension regions (not shown), possibly using additional sidewall spacers (not shown). Then, the spacer elements 107 may be formed and thereafter a second implantation sequence may be carried out, for example, in the manner as specified above, to form the regions 102, 103, wherein the second implantation cycle is thus performed with a varying lateral offset. Depending on the desired process scheme, an anneal cycle may be performed after the first implantation sequence or a common anneal cycle after the first and second implantation processes. The finally obtained dopant profile of the regions 102, 103 may be used in determining a relationship especially between the profile created in the second implantation process and the correspondingly generated overlap, wherein the first implantation may help to form an "efficient" transistor structure for a subsequent measurement of an overlap capacitance.

In operation, an appropriate control voltage is applied to the gate electrode 106 and with an appropriate and known supply voltage the current in the transistor structure 100 may be measured. From the measurement values, and the transistor parameters, such as channel length, thickness of the gate insulation layer 105 and the dielectric constant thereof, as well as of the transistor dimensions in the width dimension, i.e., the direction perpendicular to the drawing plane of FIG. 1a, the gate capacitance, i.e., the capacitance between the gate electrode 106 and the channel region 104, the overlap capacitance and any stray capacitance may be evaluated with high precision. Evidently, the overlap capacitance is directly related to the size of the overlap region 108 and may thus represent a measure of the lateral position of the region 103 with respect to the gate electrode 106. As is apparent from FIG. 1a, the lateral size of the overlap region 108 may be changed by varying the spacer width 109 during the formation of the spacer elements 107, when the subsequent implantation, diffusion and anneal steps are carried out substantially without any modification. For example, reducing the spacer width 109 will increase the overlap region 108, whereas an increase of the spacer width 109 will lead to a reduction of the overlap region 108, while the overall characteristics of the region 103 may remain substantially unchanged. Since the overlap capacitance generated by the overlap region 108 is directly related to the actual size of the overlap region 108, a change of the overlap capacitance that is measurable with high accuracy corresponds to a change in the lateral position of the region 103 and thus allows a highly cost-efficient and precise evaluation of implantation, diffusion and anneal variants as will be discussed in more detail with reference to FIGS. 1b-1e.

FIG. 1b schematically shows a cross-sectional view of a portion of a semiconductor structure 100a, which may be substantially of the same type as the transistor structure 100 shown in FIG. 1a. For convenience, similar or equivalent parts are denoted by the same reference numerals, whereas other features substantially corresponding to the features shown in FIG. 1a but differing therefrom by size or position are indicated with an additional "a" in the reference numeral. The transistor structure 100a of FIG. 1b may be formed in accordance with the process steps as described with reference to FIG. 1a, wherein well-defined process conditions have been used to form the spacer elements 107 with a predefined width 109a, the accuracy of which is determined by the deposition accuracy as specified above. Moreover, the doped region 103a exhibits a well-specified dopant profile, which for convenience is also referred to as 103a and may be used as a reference profile. As previously explained, the size of the overlap region 108a is determined by the spacer width 109a and the process parameters in forming the reference profile 103a. Since the spacer width 109a is known, the overlap capacitance of the transistor structure 101a, created by the overlap region 108a, may readily be determined and is indicated as CA.

FIG. 1c schematically shows a portion of a transistor structure 100b, which is substantially of the same type as that of FIG. 1b. The corresponding parts or components are denoted by the same reference numerals, whereas dimensions and parts differing from FIG. 1b have an additional "b" in the reference numeral. The transistor structure 100b comprises the spacer elements 107 having a width 109b that is increased compared to the spacer width 109a in FIG. 1b. Consequently, the size of the overlap region 108b is less than that of the overlap region 108a, since the region 103a in FIG. 1c is substantially identical to that of FIG. 1b, i.e., the dopant profiles are substantially identical, due to the essentially same process conditions in forming the doped region 103a of the structures 100a and 100b. Similarly, as described above, an overlap capacitance CB may be obtained that corresponds to the overlap region 108b. Thus, from the experimentally obtained overlap capacitances CA and CB, a relationship may be established, linking the lateral position of the reference file 103a to a lateral offset with respect to the gate electrode 106.

The gate electrode 106 and the spacer element 107 may be considered as a step-like implantation mask, resulting in the same dopant distribution, i.e., the extension of the reference profile 103a beyond the step-like implantation mask formed by the gate electrode 106 and spacer element 107 is substantially the same. That is, the size of the overlap region 108a plus the spacer width 109a approximately equals the size of the overlap region 108b plus the spacer width 109b. On the other hand, a different formation process of an arbitrary dopant profile exhibiting, therefore, an unknown extension beyond the step-like structure formed of the gate electrode 106 and the spacer element 107 may be characterized by the corresponding overlap capacitance generated by the unknown dopant profile. For a given width of the spacers 107, the overlap capacitance of the unknown profile may then be assessed on the basis of the profile 103a as will be described in more detail later on.

Figure 1D:
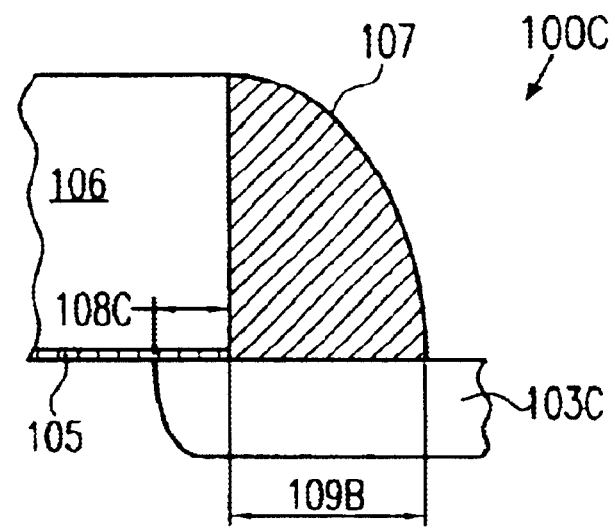

FIG. 1d schematically shows a transistor structure 100c that is quite similar, for example, to the structure 100a of FIG. 1c, except for the doped region, i.e., the dopant profile 103c, since the dopant profile 103c may have been formed with at least one differing process parameter compared to the process sequences used in the formation of the reference profile 103a. Accordingly, the overlap region 108c may have a different size even if the spacer width 109b corresponds to that of the spacer 107 of FIG. 1c. During operation of the transistor structure 100c, the corresponding overlap capacitance, indicated as CC, may be measured and may then be used to determine a difference in the lateral extension of the dopant profile 103c compared to that of the reference profile 103a FIG. 1e schematically shows a graph representing the measurement results for the overlap capacitances CA, CB and CC with respect to the corresponding spacer widths 109a and 109b. The vertical axis represents the measurement result of the overlap capacitance in femto-Farad (fF), whereas the horizontal axis indicates the spacer width in nanometers. In FIG. 1e, the overlap capacitances CA, CB having values of 0.4 and 0.3 fF, respectively, for the reference profile 103a are plotted versus the respective spacer width 109a, 109b, which in the present example were determined to be 10 nm and 15 nm, respectively. Assuming a linear relation between the overlap capacitance and the spacer width, as indicated by the straight line connecting CA and CB, the overlap capacitance changes with 0.1 fF per 5 nm spacer width variation. The overlap capacitance CC is determined to be 0.38 fF for the spacer width 109b of 15 nm. From the graph of FIG. 1e or by calculation, the corresponding spacer width may be estimated and is approximately 11 nm. This means that the overlap capacitance CC would require a spacer width of 11 nm if the lateral extension of the profile 103c would correspond to the lateral extension of the reference profile 103a. Since the actual spacer width used for forming the profile 103c was substantially equal to the spacer width 109b of 15 nm, the dopant profile 103c may thus exhibit approximately 4 nm more lateral extension. Consequently, the process for forming the profile 103c may lead to a significantly larger lateral extension compared to the process used for forming the reference profile 103a.

It should be appreciated that the above-described example is of illustrative nature only and a plurality of variations and modifications may be performed without departing from the present invention. For instance, in one embodiment, a plurality of differing spacer widths may be used in forming the reference profiles 103a to establish a corresponding relationship between the respective overlap capacitance and the spacer width more precisely. In FIG. 1e, an additional overlap capacitance CD of approximately 0.2 fF at a spacer width of 20 nm is shown as a third reference value for establishing the change of overlap capacitance with spacer width variation. In other cases, a plurality of reference overlap capacitances may be used.

In other embodiments, a more complex mathematical function may be established on the basis of the measurement results for a plurality of overlap capacitances, such as CA, CC and CD, to provide an analytical expression or a corresponding reference curve. For example, the measurement results or theoretical considerations may indicate a non-linear relationship between the overlap capacitance and the spacer width owing to, for instance, a lateral concentration gradient of the profiles 103a and 103b. The mathematical function may then allow the assignment of an arbitrary spacer width to a corresponding overlap capacitance even for a non-linear behavior. Obtaining an analytical expression for the reference curve may be obtained by any known fit techniques.

Moreover, once a corresponding relationship between the overlap capacitance and the spacer width for a reference profile, such as the reference profile 103a, is established, the spacer width for measuring the overlap capacitance CC of the profile 103c does not need to correspond to one of the spacer widths used for measuring the reference values CA, CC or CD.

In one illustrative embodiment, the measurement results for the overlap capacitance may be compared with corresponding two-dimensional simulation calculations for implant and diffusion cycles, and respective small-signal device simulation calculations may be carried out to compare the measurement results, for instance the results CA, CC, CD, CB, with the corresponding calculation results based on the small-signal simulation and the two-dimensional process simulation. In this way, an absolute value for the size of the overlap region 108 may be determined, or at least the accuracy of the experimentally determined offset difference of the profile to be assessed may be enhanced. Moreover, the measurement results, actually representing lateral charge carrier profiles, may be "translated" into dopant profiles by comparison with the simulation calculations.

Furthermore, a systematic deviation of the calculated lateral dopant profiles compared to the measurement results may be used to adapt the simulation programs to the measurement results and then statistical fluctuations may be reduced in further measurement cycles, even if merely a low number of measurements are taken, since the adapted simulation program may be able to "smooth" the obtained measurement results. Hence, even for a low number of test structures, the characteristics of the carrier profile and thus of the process sequence for forming the respective dopant profile may be determined with high precision.

In a further embodiment, the measurement results obtained by one of the embodiments described above may be employed to calibrate a two-dimensional process simulation program, which then enables the development and design of an according process sequence for forming doped regions by software within short time periods without requiring expensive process and metrology tools.

In other embodiments, a reference profile, such as the profile 103a, may be examined for two or more different spacer widths by other techniques as previously mentioned to establish an adaptation or correction factor that allows a conversion of measurement results according to the present invention and measurement results obtained by other methods. In this way, a library of different reference profiles may be established, relating various reference curves generated by the present invention with corresponding measurement results obtained by other methods. This enables process engineers to conveniently compare and assess experimental data provided by different methods for various types of reference profiles.

In one embodiment of the present invention, two or more of the transistor structures 100a, 100b and 100c may be formed on the same substrate so that any parameter drift of process steps performed substantially in the same way for all the transistor structures may substantially be cancelled, thereby improving the measurement accuracy. For instance, the transistor structures 100a, 100b, 100c may be formed in a common manufacturing process wherein different thicknesses of the dielectric layer are provided during the formation of the spacer elements 107. For instance, the substrate portion bearing the transistor structure 100a may be covered by a resist mask after depositing a specified thickness of, for example, silicon dioxide that is appropriate to yield the spacer width 109a. After the formation of the mask, the deposition process may be continued to provide on those portions of the substrate bearing the structures 100b, 100c a layer thickness that is appropriate to obtain the spacer width 109b. Thereafter, the profiles 103a may be formed in the structures 100a, 100b by means of a specified implantation scheme, while the structure 100c is covered by a resist mask. Subsequently, the dopant profile 103c is generated while the structures 100a and 100b are covered by a corresponding resist mask. This embodiment may be advantageous when the same anneal conditions are used for the activation of the profiles 103a and 103c. For example, the influence of the tilt angle in the implant may readily be investigated in that a plurality of subsequent masking and implant steps may be carried out.

In other embodiments, a plurality of reference profiles 103a, which may differ from each other, and/or a plurality of profiles 103c under investigation may be formed on a single substrate in the same manufacturing process.

In other embodiments, the transistor structures 100a, 100b and 100c may be formed on different substrates wherein advantageously these substrates are processed within a restricted time interval so as to minimize variations of processes that are identical for all of the transistor structures. In this way, even subtle differences introduced by different anneal conditions may be determined.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    identifying a relationship between a capacitive coupling of a conductor and a doped region formed in a semiconducting substrate under said conductor based upon an overlap between said conductor and said doped region;
    forming a second doped region under a second conductor; and
    assessing a lateral dimension of an overlap of said second doped region with said second conductor based upon said identified relationship.

2. The method of claim 1, wherein said identified relationship is a linear relationship.

3. The method of claim 1, wherein said identified relationship is a non-linear relationship.

4. The method of claim 1, wherein identifying said relationship includes:
    determining a first capacitive coupling of a reference dopant profile formed in said doped region to said conductor laterally offset from said reference dopant profile by a first dielectric region having a first offset thickness; and
    determining a second capacitive coupling of said reference dopant profile formed in a third doped region to a third conductor laterally offset from said reference dopant profile by a second dielectric region having a second offset thickness.

5. The method of claim 4, further comprising:
    determining a capacitive coupling of a test dopant profile formed in said second doped region to said second conductor laterally offset from said second doped region by a third dielectric region having a predefined offset thickness; and
    assessing a lateral distribution of said test dopant profile on the basis of said first and second capacitive couplings and said first, second and predefined offset thicknesses.

6. The method of claim 5, wherein said reference dopant profile and said test dopant profile, said conductor and said second and third conductors and said doped region and said second and third doped regions are portions of a first, a second and a third transistor structure, respectively.

7. The method of claim 6, wherein the dimensions and materials of said first, second and third transistor structures are substantially identical.

8. The method of claim 5, further comprising establishing a mathematical relationship between said first and second capacitive couplings and said first and second offset thicknesses, respectively.

9. The method of claim 8, further comprising determining a change of capacitive coupling for a variation of offset thickness for said reference dopant profile.

10. The method of claim 5, wherein said predefined offset thickness is substantially the same as one of said first and the second offset thicknesses.

11. The method of claim 5, further comprising determining a difference of a lateral extension of said reference dopant profile and said test dopant profile.

12. A method, comprising:
    determining a first capacitive coupling of a reference dopant profile formed in a first semiconductor region to a first conductive region laterally offset from said reference dopant profile by a first dielectric region having a first offset thickness;
    determining a second capacitive coupling of said reference dopant profile formed in a second semiconductor region to a second conductive region laterally offset from said reference dopant profile by a second dielectric region having a second offset thickness;
    determining a capacitive coupling of a test dopant profile formed in a third semiconductor region to a third conductive region laterally offset from said third semiconductor region by a third dielectric region having a predefined offset thickness; and
    assessing a lateral distribution of said test dopant profile on the basis of said first and second capacitive couplings and said first, second and predefined offset thicknesses.

13. The method of claim 12, wherein said reference dopant profile and said test dopant profile, said first, second and third conductive regions and said first, second and third dielectric regions are portions of a first, a second and a third transistor structure, respectively.

14. The method of claim 13, wherein the dimensions and materials of said first, second and third transistor structures are substantially identical.

15. The method of claim 12, further comprising establishing a mathematical relationship between said first and second capacitive couplings and said first and second offset thicknesses, respectively.

16. The method of claim 15, further comprising determining a change of capacitive coupling for a variation of offset thickness for said reference dopant profile.

17. The method of claim 12, wherein said predefined offset thickness is substantially the same as one of said first and the second offset thicknesses.

18. The method of claim 12, further comprising determining a difference of a lateral extension of said reference dopant profile and said test dopant profile.

19. The method of claim 18, further comprising performing a simulation for a process of forming said reference dopant profile and said test dopant profile; and comparing a result of said simulation with said difference.

20. The method of claim 19, further comprising simulating said first, second and third capacitive couplings by small signal simulation and obtaining a theoretical value of said difference of the lateral extension on the basis of said process simulation and said small signal simulation result.

21. The method of claim 12, further comprising simulating a two-dimensional formation process for forming said reference dopant profile and said test dopant profile and adapting said two-dimensional process simulation on the basis of said lateral distribution.

22. A method of assessing an implanted dopant profile, the method comprising:

forming a first gate electrode structure with a first sidewall spacer having a first width;

forming a second gate electrode structure with a second sidewall spacer having a second width;

forming a dopant profile adjacent to said first and second gate structures with substantially the same process conditions and using said first and second sidewall spacers as an implantation mask, each dopant profile acting as source and drain of a first transistor and a second transistor; and determining an overlap capacitance of said first and second transistors to establish a dependence of overlap capacitance variation with spacer width variation for said dopant profile.

23. The method of claim 22, wherein said first and second gate structures are substantially identical.

24. The method of claim 22, further comprising forming a third transistor having a gate electrode structure with a predefined sidewall spacer width with a test dopant profile.

25. The method of claim 24, further comprising determining an overlap capacitance of said third transistor and estimating a lateral extension of said test dopant profile on the basis of said dependence.

26. The method of claim 24, wherein said predefined sidewall spacer width of said third transistor substantially corresponds to one of said first and second spacer widths.

27. The method of claim 22, further comprising:

forming at least one more transistor having said dopant profile and having a sidewall spacer width other than said first and second widths; and determining an overlap capacitance of said at least one more transistor.

28. The method of claim 27, wherein establishing said dependence comprises obtaining a mathematical expression based on the overlap capacitances of said first, second and the at least one more transistors.

29. The method of claim 22, further comprising performing a simulation for a process of forming said dopant profile and comparing a result of said simulation with said dependence.

30. The method of claim 29, further comprising adapting said dependence in accordance with a result of said comparison.

31. The method of claim 22, further comprising simulating said overlap capacitances of said first and second transistors by small signal simulation and obtaining a theoretical value of a lateral extension of said profile on the basis of said process simulation and said small signal simulation result.

32. The method of claim 24, further comprising determining a difference in the lateral extension of said dopant profile and said test dopant profile by using said dependence and said predefined sidewall spacer width.

33. The method of claim 22, wherein said first and second transistors are formed on a common substrate.

34. The method of claim 22, wherein said first, second and third transistors are formed on a common substrate.

35. The method of claim 24, wherein at least one process parameter of a formation process in forming said test dopant profile is changed compared to a formation process of said dopant profile.

36. The method of claim 35, wherein said at least one process parameter relates to at least one of an implantation process and an annealing process.

* * * * *